(12) United States Patent
Jiang et al.

(10) Patent No.: US 10,453,700 B2
(45) Date of Patent: Oct. 22, 2019

(54) LOW DAMAGE LOW-K DIELECTRIC ETCH

(71) Applicant: Texas Instruments Incorporated, Dallas, TX (US)

(72) Inventors: Ping Jiang, Plano, TX (US); David Gerald Farber, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/973,973

(22) Filed: Dec. 18, 2015

(65) Prior Publication Data

US 2017/0178955 A1  Jun. 22, 2017

(51) Int. Cl.
*H01L 21/311* (2006.01)
*H01L 21/3105* (2006.01)
*H01L 21/768* (2006.01)

(52) U.S. Cl.
CPC .... *H01L 21/31144* (2013.01); *H01L 21/3105* (2013.01); *H01L 21/31116* (2013.01); *H01L 21/31138* (2013.01); *H01L 21/76808* (2013.01); *H01L 21/76814* (2013.01); *H01L 21/76826* (2013.01)

(58) Field of Classification Search
CPC ........... H01L 21/3105; H01L 21/31116; H01L 21/31138; H01L 21/76808; H01L 21/76814; H01L 21/76826

USPC .................................................. 438/618, 622
See application file for complete search history.

(56) References Cited

U.S. PATENT DOCUMENTS

| | | | | |
|---|---|---|---|---|
| 7,741,224 B2* | 6/2010 | Jiang | .................... | H01L 21/3105 257/759 |
| 2005/0054209 A1* | 3/2005 | Hsu | ...................... | H01L 21/2652 438/725 |
| 2006/0063388 A1* | 3/2006 | Yang | ................. | H01L 21/76838 438/745 |

* cited by examiner

*Primary Examiner* — Dale E Page
*Assistant Examiner* — Quovaunda Jefferson
(74) *Attorney, Agent, or Firm* — Jacqueline J. Garner; Charles A. Brill; Frank D. Cimino

(57) ABSTRACT

A method of forming an interconnect structure for an integrated circuit. A dielectric stack is formed on the substrate including an etch-stop layer, a low-k or ULK dielectric layer, and a hard mask layer. The low-k or ULK dielectric is etched using at least two etching processes wherein each etching process is followed by an etch repair process where the etch repair process includes flowing at least one hydrocarbon into the reactor and generating a plasma. The photoresist may be removed using at least two ashing processes wherein each ashing process is followed by an ash repair process where the etch repair process includes flowing at least one hydrocarbon into the reactor and generating a plasma.

20 Claims, 7 Drawing Sheets

LOW DAMAGE LOW-K DIELECTRIC ETCH

FIELD OF THE INVENTION

The present invention relates to plasma processing for integrated circuits, resulting structures, and integrated circuits therefrom.

BACKGROUND

Interconnect (RC) delay is known to be a major limiting factor in the drive to improve the speed and performance of integrated circuits (ICs). For performance and cost reasons, it is desirable to have adjacent conductors as close as possible to one another. Since interconnect delay depends on both the dielectric constant of the insulating material that separates the interconnect conductors and the thickness of this insulating material, the interconnect delay can be reduced by using low dielectric constant materials such as ultra low-k (ULK) dielectric materials. Low-k dielectric materials refer to those insulating materials that have a dielectric constant (k) lower than that of silicon dioxide ($SiO_2$) (k=3.9) and generally having k<=3. Ultra low-k dielectric materials generally have k-values less than about 2.6.

An important class of low-k and ULK dielectric materials is referred to as substitution-group depleted silicon oxide. By way of definition, these low-k and ULK materials have the chemical formula $R_1R_2SiO_x$, where $R_1$ and $R_2$ refer to a hydrocarbon group such as a methyl group, an ethyl group, or a phenyl group or hydrogen. Such organo-silicate low-k and ULK dielectric films (organo-silicate glass=OSG) provide dielectric constants as low as about 2.0.

When the surface of OSG is exposed to oxidative or reductive reactive species such as are found in plasmas used to etch the OSG and used to remove (ash) resist patterns from the OSG, R1 and R2 groups may be removed from the OSG and replaced with O, OH, H or a dangling bond. When this occurs (often referred to as carbon depletion of OSG) it raises the dielectric constant and reduces the structural integrity of the OSG film. ULK dielectric films are more susceptible to plasma damage than low-k films.

It was discovered as described by Jiang et. al. in U.S. Pat. No. 7,741,224 hereby incorporated in its entirety for reference that performing a hydrocarbon plasma treatment of low-k and ULK dielectric films post etch and/or post ash can partially repair the damaged OSG and partially recover the dielectric constant.

Figure 1:
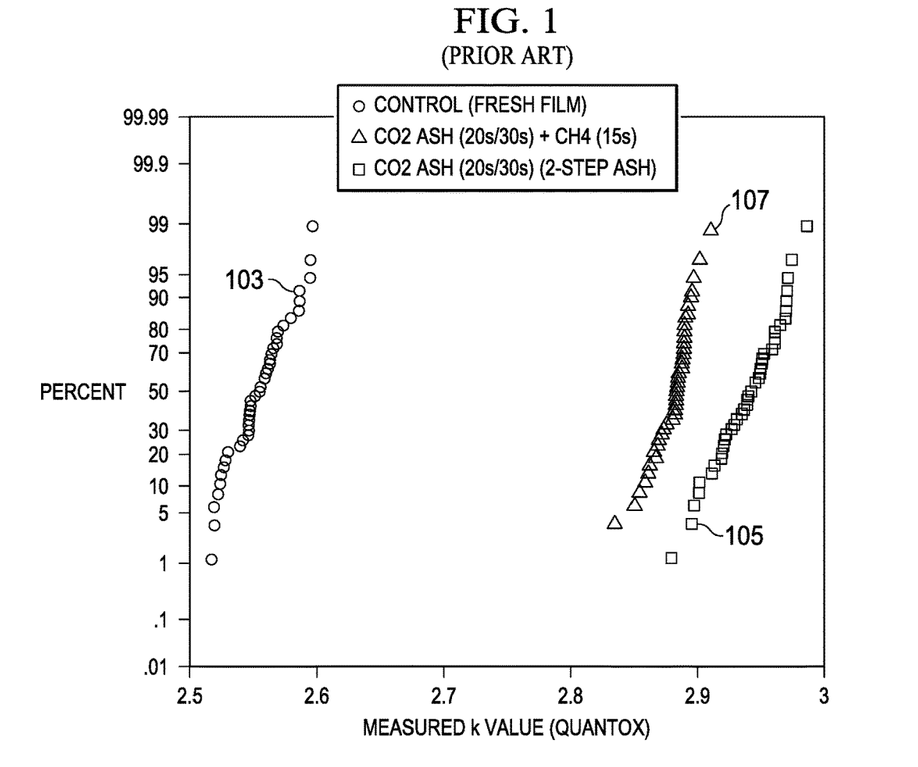
FIG. 1 (Prior art) is a cumulative probability plot of the dielectric constant of an ultra-low-k film as deposited and after exposure to plasma ashing.
Figure 2:
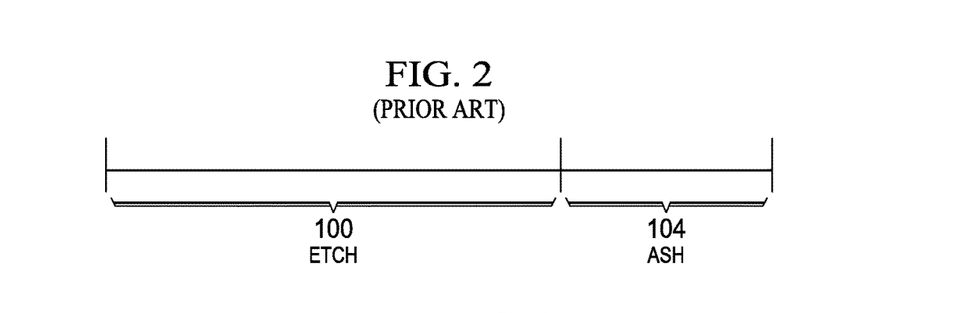
FIG. 2 (Prior art) is a diagram of a prior art ultra-low-k dielectric etch and ash process.

As shown in the cumulative probability plot in FIG. 1 the dielectric constant (k) of an ultra-low-k OSG film as deposited 103 may be between 2.5 and 2.6. After an etch process 100 followed by a resist removal (ash) process 104 as illustrated in FIG. 2, damage to the exposed ULK surface caused by reactive species in the plasmas may raise the k value to 2.9 or greater (graph 105 in FIG. 1).

Figure 3:
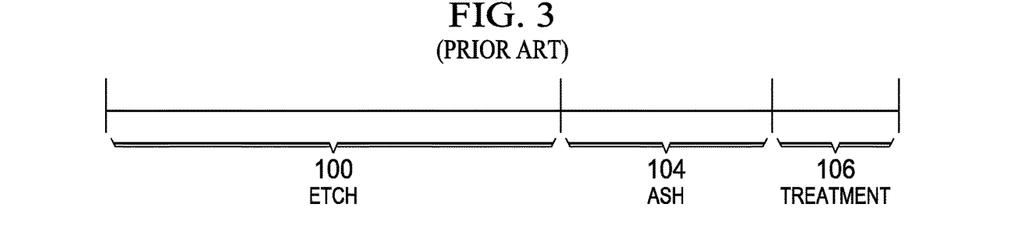
FIG. 3 (Prior art) is a diagram of a prior art ultra-ultra-low-k dielectric etch and ash process

Performing a hydrocarbon plasma treatment 106 post ash 104 as is illustrated in FIG. 3, can repair some of the plasma damage and reduce the k value of the low-k film by about 1 unit as shown by the graph 107 in FIG. 1.

Unfortunately the dielectric constant of the low-k OSG is still significantly higher (median value ~2.87) than the dielectric constant of the low-k OSG film as deposited (median value ~2.55).

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A method of forming an interconnect structure for an integrated circuit, including providing a substrate and forming a dielectric stack on the substrate including an etch-stop layer, a low-k dielectric layer, and a hard mask and/or cap layer. The method further includes patterning a photoresist masking layer on the dielectric stack to define a plurality of feature defining regions. The plurality of features is etched into the hard mask and/or cap layer. The low-k dielectric is etched using at least two etching processes wherein each etching process is followed by an etch repair process where the etch repair process includes flowing at least one hydrocarbon into the reactor and generating a plasma. The photoresist may be removed using at least two ashing processes wherein each ashing process is followed by an ash repair process where the ash repair process includes flowing at least one hydrocarbon into the reactor and generating a plasma. The method also includes forming a metal conductor in the plurality of features.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 4A:
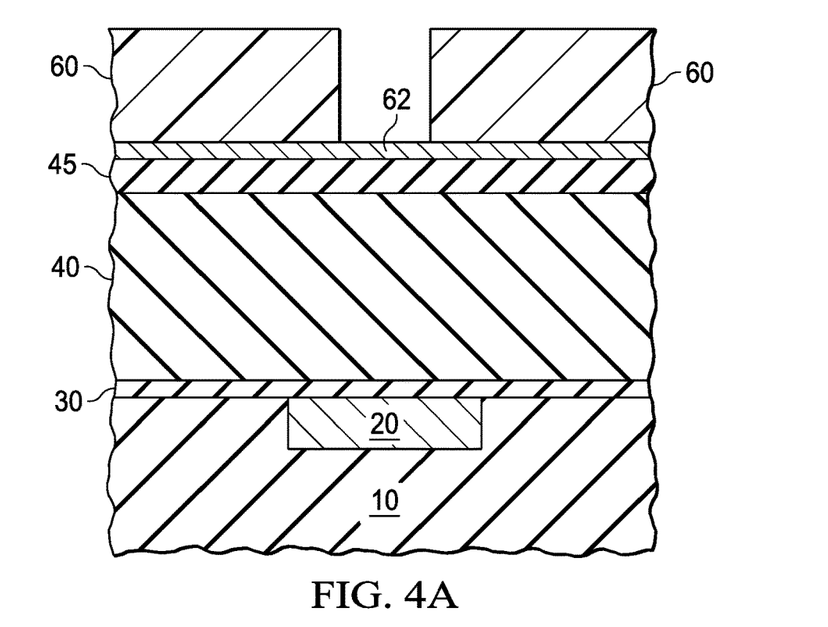
FIG. 4A-4H are cross sections of interconnect formed in ultra-low-k dielectric depicted in successive stages of fabrication of a full via-first dual damascene process.
Figure 4B:
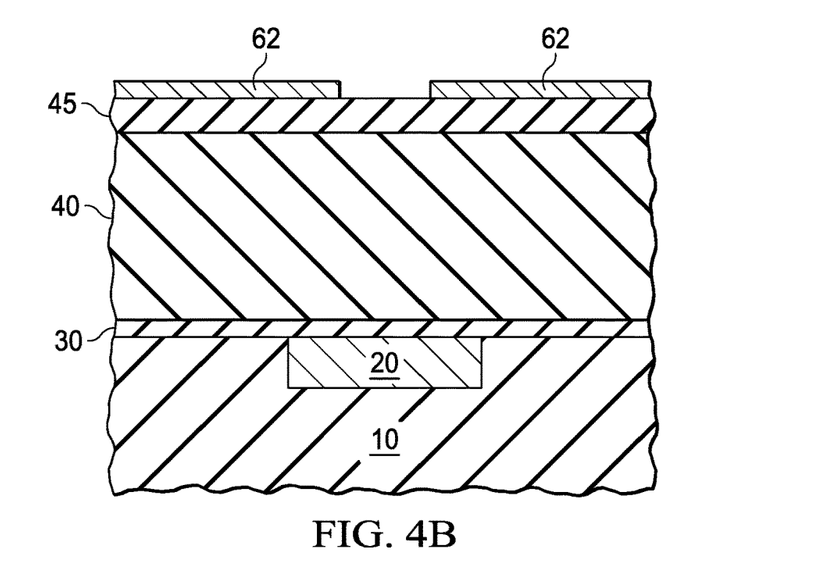
Figure 4C:
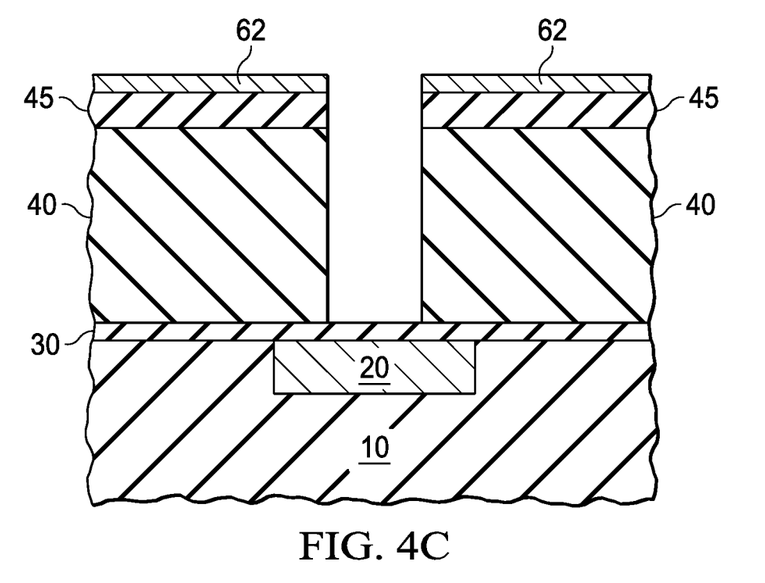
Figure 4D:
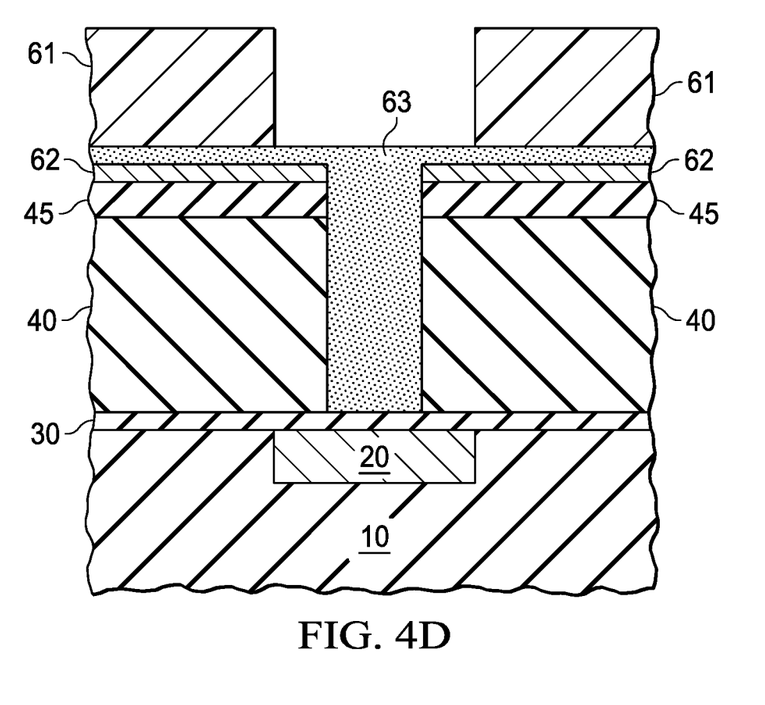
Figure 4E:
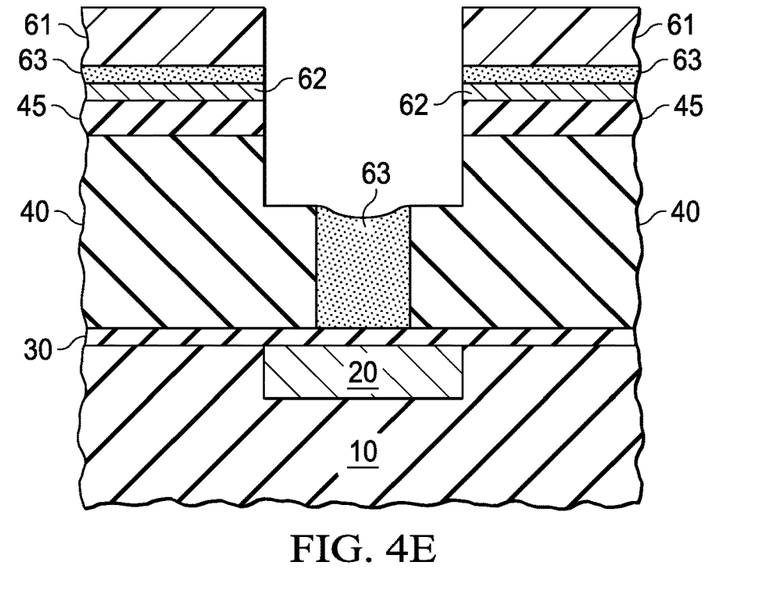
Figure 4F:
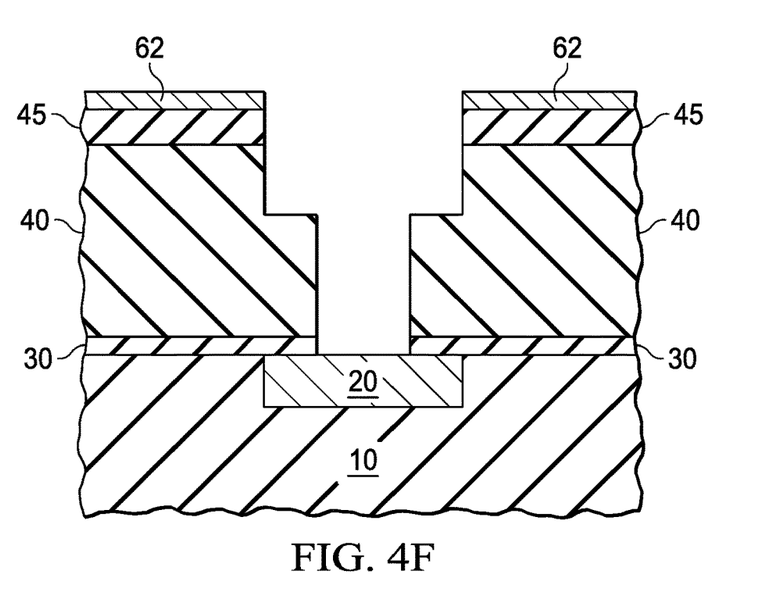
Figure 4G:
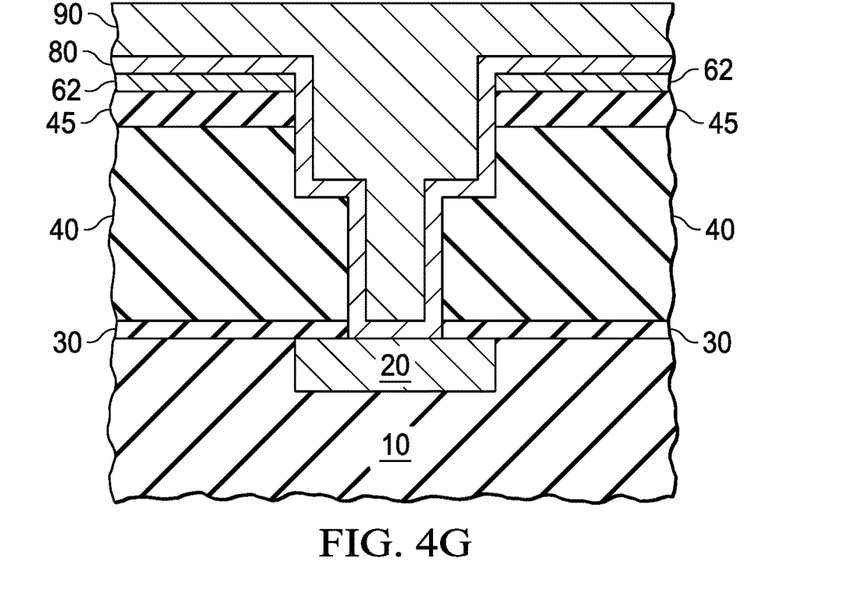
Figure 4H:
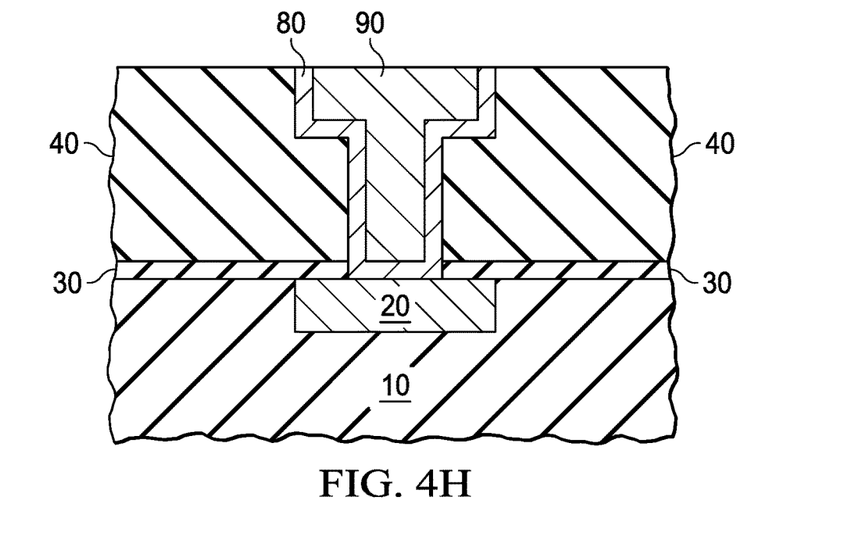
Figure 5:
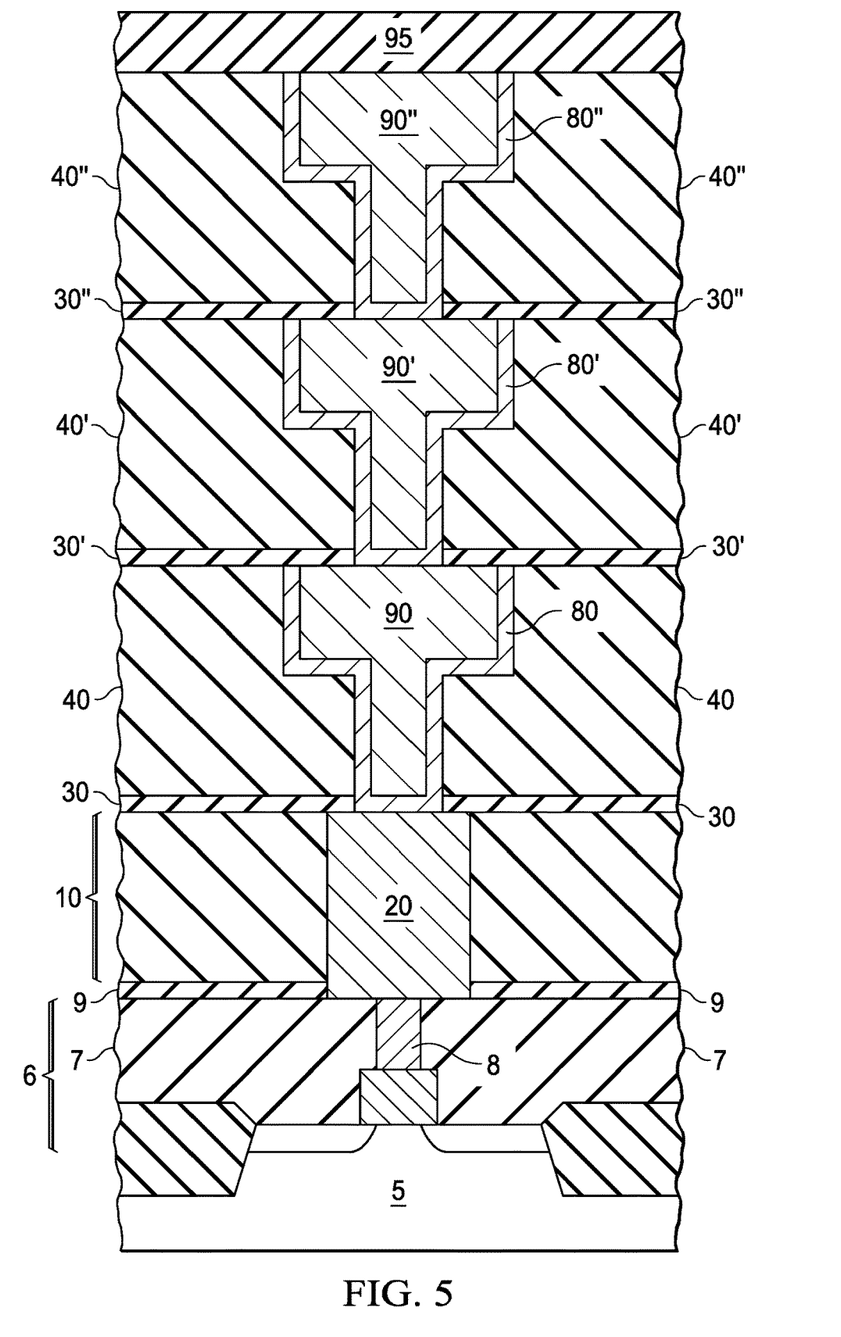
FIG. 5 is a cross sectional view of a completed integrated circuit interconnect structure fabricated in accordance with an embodiment of the present invention.

Referring to FIGS. 4A through 4H the construction of an integrated circuit according to an embodiment of the invention will now be described. This example refers to a fully etched via-first dual damascene copper metallization process flow, although of course the invention can be used in connection with other processes and process flows, such as partial via-first damascene, trench-first dual damascene or single damascene processes. FIG. 4H illustrates, in cross-section, portions of a partially fabricated integrated circuit, having metal conductor 20 disposed in and isolated from other conductors and active structures by dielectric layer 10. The metal conductors 20, 90, 90', and 90", as illustrated in FIG. 5, can connect down to active devices 6 by a metal contact 8. The active devices 6 can be isolated from each other by a dielectric layer 7. As illustrated in FIG. 5, dielectric layer 7 can overly a semiconducting surface of a substrate 5 and the active devices 6, such as transistors, resistors, diodes and the like. Dielectric layers 7 and 10 can be formed from the same or different dielectric materials, such as $SiO_2$, OSG, fluorinated silica glass (FSG), phosphorous-doped silica glass (PSG), or any other suitable dielectric material. Conductors 20 in the dielectric layer 10 can be formed according to the embodiments of the invention. For example, the dielectric layers 7 and 10 can be separated by etch-stop and/or adhesive layers 9, as described below. For purposes of this description, however, the method will be described in connection with the formation of a metal interconnect layer in overlying dielectric layer 40 using a fully etched via-first method.

As shown in FIG. 4A etch-stop layer 30 can be disposed over dielectric layer 10 and metal conductor 20. Low-k or ultra low-k (ULK) dielectric layer 40 can be deposited over etch-stop layer 30. In this exemplary embodiment of the invention, low-k or ULK dielectric layer 40 can be a substitution group depleted silicon oxide low dielectric constant material, such as an OSG. Examples of such OSG materials include the CORAL™ family of low-k dielectrics available from Novellus Systems, Inc. and the BLACK DIAMOND™ family of low-k dielectric available from Applied Materials. However, other organosilicate materials can also be used with the invention, such as the LKD™ series of dielectric materials available from JSR Corporation, of which LKD-5109™ is a particular example. Numerous other types of organosilicate and OSG materials can be used with various embodiments of the present invention. The low-k or ULK dielectric layer 40 can be deposited in the conventional manner for such material, either by a spin-on technique or by chemical vapor deposition (CVD), as appropriate for the particular material. Etch-stop layer 30 can be formed of a material resistant to etchants for etching low-k or ULK dielectric layers 40, as used to form a via to metal conductor 20, for example. Etch-stop layer 30 can also operate as an adhesion layer to enable low-k or ULK dielectric layer 40 to adhere to dielectric layer 10. Materials useful for the etch-stop layer 30 include silicon nitrides, silicon carbides, other etch-resistant materials, or any combination of layers thereof and can have relatively low dielectric constants. For example, an etch-stop layer 30 can comprise a layer of SiCN or $Si_3N_4$, a SiCO/SiCN stack, or a SiCO/$Si_3N_4$ stack.

Optionally, a cap dielectric layer 45 can overlie ULK dielectric layer 40. Such a cap dielectric layer 45 can protect the surface of the ULK dielectric layer 40 from subsequent via, trench, or etch-stop etches, and from chemical mechanical polishing (CMP) after metal deposition. Examples of the material of such a cap dielectric layer can include TEOS, silicon carbide, and silicon carbonitride.

A hard mask layer 62, as shown in FIG. 4A is formed over the surface of ULK dielectric layer 40 and capping layer 45 if present. Hard mask layer 62 can be a material resistant to etch processes used to etch vias as well as trenches, and can be formed from either electrically conducting, semiconducting, or an electrically insulating dielectric materials. Examples of materials for hard mask layer 62 can include silicon nitride, silicon carbide, tantalum nitride and titanium nitride.

As shown in FIG. 4A photoresist 60 can be deposited over the surface of hard mask layer 62, and photo lithographically patterned to define regions in which vias are to be formed. The particular material for photoresist 60 can depend upon the photolithography wavelength and process to be used, as well as upon the target dimensions for the via. A bottom anti-reflective coating, or BARC, (not shown) can optionally be applied prior to via pattern photoresist 60, to assist in the photolithography used to expose the via pattern photoresist 60.

As shown in FIG. 4B, after developing the via pattern photoresist 60, the defined feature regions can be etched into the hard mask layer 62. The via photoresist pattern 60 may then be removed if the hardmask material is a metal such as TaN or TiN. If the hardmask material is a dielectric material such as SiC or SiN, the via photoresist pattern 60 may be retained during the etch because of the lower selectivity of these hardmask materials to the etch.

Referring now to FIG. 4C the patterned via features can be etched through the optional capping layer 45, and through the ULK dielectric layer 40 stopping on etch-stop layer 30. The via etch can be a plasma etch using a fluorine containing molecule such as $CF_4$, $NF_3$, $C_4F_8$ and optionally an inert gas such as Ar. The via etch typically uses bias so that the via etch is anisotropic. A via etch process typically consists of a main etch process and an over-etch process. In the main etch process, example process conditions are 100 mT pressure, 500 Watts source power, 600 Watts bias power, 200 sccm $CF_4$, 200 sccm Ar, and a temperature of 20° C. In the via over-etch process, example process conditions are 60 mT pressure, 400 Watts source power, 800 Watts bias power, 10 sccm $C_4F_8$, 120 sccm $N_2$, 800 sccm Ar, and a temperature of 20° C.

Referring now to FIG. 4D the via opening is filled with an organic material 63 such as a photoresist or BARC (bottom anti-reflection coating) layer deposited using a process such as spin coating. This prevents the trench etch from etching through the etch-stop layer 30 and damaging the underlying metal lead 20. The trench photoresist pattern 61 is then formed on the via fill organic material 63 over the via opening.

As shown in FIG. 4E, the trench is then etched through the via fill organic material 63, through the hard mask layer, through the optional capping layer 45, and into the ULK layer 40 to form the interconnect trench. Example process conditions for the trench etch are 100 mT pressure, 500 Watts source power, 600 Watts bias power, 200 sccm $CF_4$, and a temperature of 20° C.

Reactive species in the via etch and trench etch plasmas damage the exposed ULK dielectric film 40 causing the dielectric constant to increase. Some of the damage may be repaired by following the via and trench plasma etches with an in situ plasma treatment containing a hydrocarbon such as $CH_4$, $C_2H_6$, other saturated hydrocarbons ($C_nH_{2n+2}$ where n>=3) or unsaturated hydrocarbons ($C_nH_{2n}$ where n>=1). The post via etch and trench etch hydrocarbon plasma treatment removes some of the damage and lowers the dielectric constant somewhat, but the dielectric constant after the post etch treatment remains significantly higher than the deposited ULK dielectric film 40. It has been discovered that interposing several hydrocarbon plasma treatment (etch repair) processes during via and trench etches can minimize and almost eliminate the plasma damage and can preserve the low dielectric constant value. For example a 40 sec plasma trench etch process may be broken up into four 10 sec trench etch sub-processes with each 10 sec trench etch sub-process followed by a trench etch repair process. The trench etch repair processes may be performed for 5 sec to 20 sec using 0.1 sccm-300 sccm hydrocarbon gas. Additional process conditions may include: 0-500 sccm inert gas, pressure of 5 mT to 100 mT, 100 Watts to 1000 Watts source power, 0 Watts to 1000 Watts bias power, and a temperature in the range of 20° C. to 60° C. Typically the trench etch repair processes are performed in situ using the same chamber and same chamber temperature as the trench etch sub-processes. An example interconnect trench can be formed using four 10 sec plasma trench etch sub-processes using 100 mT pressure, 500 Watts source power, 600 Watts bias power, 200 sccm $CF_4$, and a temperature of 20° C. Each of the four 10 sec trench etch sub-processes can be followed by a 5 sec trench etch repair process using 10 mT pressure, 750 Watts source power, 500 Watts bias power, 100 sccm $CH_4$, 100 sccm Ar, and a temperature of 20° C.

Similarly the via etch can be divided into a series of via etch sub-processes with each via etch sub-process followed by a via etch repair processes.

In FIG. 4F the photoresist pattern 61 and the via fill organic material 63 is then removed by a plasma ash process as is conventionally performed in the art. For example, a suitable ash process for removing trench photoresist 61 and via fill organic material 63 from a ULK dielectric layer 40 can be a plasma ash process using $H_2$, $OP_2$, $CO_2$, or other oxygen-containing gases. Afterwards, an additional wet clean can be performed to remove any remaining photoresist residue. An example plasma ash process uses 100 mT pressure, 600 Watts bias power, 750 sccm $CO_2$, and a temperature of 20° C.

Reactive species in the ashing plasma damage the exposed ULK dielectric film 40 causing the dielectric constant to increase. Some of the damage may be repaired by following plasma ashing with an in situ plasma treatment (ash repair) containing a hydrocarbon such as $CH_4$, $C_2H_6$ and other saturated hydrocarbons ($C_nH_{2n+2}$ where n>=3) or unsaturated hydrocarbons ($C_nH_{2n+2}$ where n>=1). The ash repair when applied after the ashing process repairs some of the damage, but the dielectric constant remains significantly higher than the deposited ULK dielectric film 40. It has been discovered that interposing several ash repair processes during the via pattern and trench pattern ashing processes can minimize and almost eliminate the plasma damage and resulting increase in the dielectric constant. For example a 60 sec trench pattern or via pattern plasma ash may be broken up into six 10 sec via pattern or trench pattern plasma ashing sub-processes with each 10 sec ashing sub-process followed by a trench pattern or via pattern ash repair process. The trench pattern and via pattern ash repair processes may be performed for 3 sec to 30 sec using 0.1 sccm-300 sccm hydrocarbon gas, 0-500 sccm inert gas, pressure of 5 mT to 100 mT, 100 Watts to 1000 Watts source power, 0 Watts to 1000 Watts bias power, and a temperature in the range of 20° C. to 60° C. Typically the trench pattern and via pattern ash repair processes are performed in situ using the same chamber and same chamber temperature used for the trench pattern and via pattern ashing sub-processes. An example via ash process uses twelve 5 sec plasma via ash sub-processes using 100 mT pressure, 600 Watts bias power, 750 sccm $CO_2$, and a temperature of 20° C. Each of the twelve 5 sec via ash sub-processes is followed by a 5 sec via pattern ash repair process using 10 mT pressure, 750 Watts source power, 500 Watts bias power, 100 sccm $CH_4$, 100 sccm Ar, and a temperature of 20° C.

As shown in FIG. 4F, after the via fill organic material 63 is removed from the vias by ashing, etch-stop layer 30 is removed using a plasma etch that etches the etch-stop layer 30 with high selectivity to silicon dioxide, ULK, and low-k films and stops on the underlying conductor lead 20. For example a $CH_2F_2+N_2$ plasma can be used to remove etch-stop layer SiCN and/or SiCO. This etch stop liner etch may also be followed by an etch repair process using the hydrocarbon plasma method described above.

Referring to FIG. 4G, the metallization process then continues once etch-stop layer 30 is removed from the bottom of the via. In this exemplary embodiment of the invention, liner layer 80 can be formed of the suitable material over all features. Examples of suitable materials for use as liner layer 80 include titanium nitride, tantalum nitride, tungsten nitride, and the like. After deposition, liner layer 80 will extend not only into the via to lower level conductor 20, but also over the surface of the hard mask layer 62. A metal 90, such as copper (Cu) can be deposited for example by electroplating to fill the trenches and vias in the etched portions of the dielectric layer 40 and deposit on the surface of dielectric layer 40, liner layer 80, and also on hard mask layer 62. Chemical mechanical polishing (CMP) can then be performed to remove metal 90 overfill, liner layer 80, hard mask layer 62, and a portion or preferably all of the capping layer 45 from the top surface of ULK dielectric layer 40, leaving a conductive plug within the via through ULK dielectric layer 40, flush with the top surface of ULK dielectric layer 40. The resulting structure at this point is illustrated in FIG. 4H. The remainder of the interconnect processing then continues in the same, cyclical, manner, to form additional metal conductor levels comprising additional low-k or ULK dielectric layers (40',40"), additional etch-stop layers (30',30"), additional liner layers (80', 80"), and additional metal layers (90', 90"), as illustrated in FIG. 5. A protective overcoat (PO) layer 95, comprising a thick dielectric material (e.g., silicon oxynitride) can be deposited on the interconnect structure. Once the fabrication process is complete, the integrated circuit can be tested and packaged.

Figure 6:
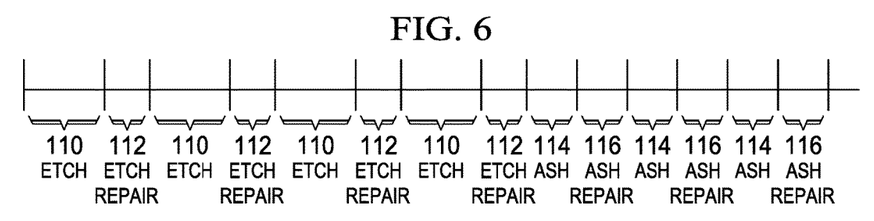
FIG. 6 is a diagram of an ultra-low-k dielectric etch, etch repair, ash, and ash repair process in accordance with an embodiment of the present invention.
Figure 7:
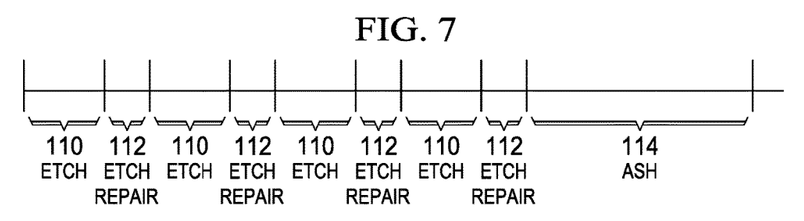
FIG. 7 is a diagram of an ultra-low-k dielectric etch, etch repair, and ash process in accordance with an embodiment of the present invention.

Although as illustrated in FIG. 6, the plasma etching and plasma ashing processes described in the example above are segmented into plasma etching (via or trench) sub-processes 110 followed by via or trench etch repair processes 112 and plasma ashing (via pattern or trench pattern) sub-processes 114 followed by ash repair processes 116, it may be advantageous to add only via or trench etch repair processes 112 after the via or trench etching sub-processes 110 as a compromise between preserving a low dielectric constant and cycle time as shown in FIG. 7. Although 4 etching repair processes 112 are shown in FIG. 7 the number of (via or trench) etching repair processes 112 may be greater than or equal to 2 according to embodiments of this invention.

Figure 8:
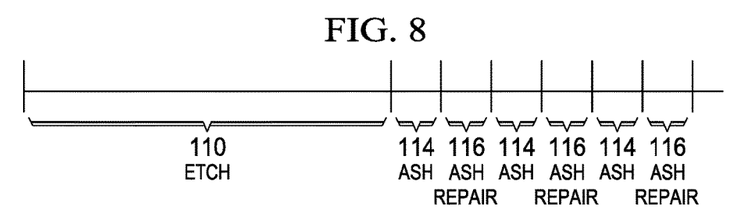
FIG. 8 is a diagram of an ultra-low-k dielectric etch, ash, and ash repair process in accordance with an embodiment of the present invention.

Similarly as shown in FIG. 8, it may be advantageous to add only ash (via pattern or trench pattern) repair processes 116 after the ashing sub-processes 114 and not add etch (via or trench) repair processes after or during the via or trench etch process 110 as a compromise between preserving a low dielectric constant and cycle time. Although 3 ash repair processes 116 are shown in FIG. 8 the number of ash repairs processes 116 may be greater than or equal to 2 according to an embodiment of this invention.

The present invention provides a method for both passivation and repair of exposed surfaces of low-k or ULK dielectric films, such as OSG films, while adding only minimal cycle time and costs. In particular, for plasma etch process that comprises plasma etch process and an in situ plasma ash process, additional in situ etch repair and ash repair processes, according to the present invention, can be added. By performing all the processes in situ, that is the etch, the etch repair, the ash, and the ash repair processes being consecutively performed in the same chamber, the exposed low-k or ULK dielectric layer 40 is not exposed to moisture or other contaminants and the amount of processing time required is reduced compared to previous methods.

Although the preferred embodiment is to perform the via etch, the trench etch, the via and trench etch repair, the via and trench pattern ash, and the ash repair processes in situ in the same chamber, the processes may be performed in separate chambers on the same etcher platform. For example, wafers can go through via and trench etch sub-processes and via and trench etch repair processes in one chamber and then be transferred under vacuum to another chamber for the via pattern and trench pattern ash sub-processes and ash repair processes.

It is believed by the present Inventors, although not essential for practicing the invention, that performing multiple etch repair and ash repair processes during the etching and ashing of the exposed low-k or ULK dielectric reduces the thickness of the damage layer on the exposed surface of the low-k or ULK dielectric layer thereby minimizing an increase of the dielectric constant and maintaining the structural integrity of the layer. It is believed that reactive radicals ($CH_3$ and H) resulting from the plasma etch repair and plasma ash repair processes interact with the surface of a carbon depleted low-k or ULK dielectric layer 40 and converted Si—$CH_3$ bonds are formed near the surface of the dielectric layer 40.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps of:
    forming an interconnect structure by:
        forming a dielectric stack on a substrate comprising an etch-stop layer, a low-k dielectric layer on the etch-stop layer, and a hard mask layer on the low-k dielectric layer;
        patterning a photoresist masking layer on the dielectric stack to define regions for a plurality of features;
        etching the plurality of features into the hard mask layer;
        plasma processing the substrate in a plasma-based reactor to etch the plurality of features into the low-k dielectric layer wherein the plasma processing comprises breaking the etch into a plurality of plasma etch sub-processes and performing an in situ etch repair process between each of the plasma etch sub-processes, wherein the etch repair process comprises flowing at least one hydrocarbon into the reactor and generating a plasma; and
    forming a metal conductor in the plurality of features.

2. The method of claim 1, wherein a flow rate of hydrocarbon into the plasma based reactor is in the range of 0.1 sccm to 300 sccm during each etch repair process.

3. The method of claim 1, wherein the low-k dielectric is an ultra-low-k dielectric.

4. The method of claim 1, wherein the plurality of features are a plurality of vias.

5. The method of claim 1, wherein the plurality of features are a plurality of trenches.

6. The method of claim 1, wherein the etch repair process is performed with a pressure in the range of 5 mT to 100 mT, a source power in the range of 100 Watts to 1000 Watts, a bias power in the range of 0 Watts to 1000 Watts, a hydrocarbon flow in the range of 10 sccm to 300 sccm, an inert gas flow in the range of 0 sccm to 500 sccm, a temperature in the range of 20° C. to 60° C., and a time in the range of 5 sec to 20 sec.

7. The method of claim 1, wherein the hydrocarbon is at least one selected from the group consisting of $CH_4$, $C_2H_6$, $C_3H_8$, other saturated hydrocarbons ($C_nH_{2n+2}$ where n≥4), and unsaturated hydrocarbons ($C_nH_{2n}$ where n≥1).

8. The method of claim 1 further comprising performing a plasma ash process to remove the photoresist masking layer, wherein the plasma ash process consists of a first plasma ash sub-process followed by an in situ first ash repair process and at least a second plasma ash sub-process followed by a second in situ ash repair process wherein each plasma ash sub-process is followed by an ash repair process and wherein the ash repair processes comprise flowing at least one hydrocarbon into the reactor and generating a plasma, wherein a flow rate of hydrocarbon into the plasma based reactor is in the range of 0.1 sccm and 300 sccm.

9. The method of claim 8, wherein the ash repair process is performed with a pressure in the range of 5 mT to 100 mT, a source power in the range of 100 Watts to 1000 Watts, a bias power in the range of 0 Watts to 1000 Watts, a hydrocarbon flow in the range of 10 sccm to 300 sccm, an inert gas flow in the range of 0 sccm to 500 sccm, a temperature in the range of 20° C. to 60° C., and a time in the range of 3 sec to 30 sec.

10. The method of claim 8, wherein the hydrocarbon is at least one selected from the group consisting of $CH_4$, $C_2H_6$, $C_3H_8$, other saturated hydrocarbons ($C_nH_{2n+2}$ where n≥4), and unsaturated hydrocarbons ($C_nH_{2n}$ where n≥1).

11. The method of claim 8 wherein the etch process, the etch repair process, the ash process and the ash repair process are all performed in situ in the same chamber on the plasma-based reactor.

12. The method of claim 8 wherein the etch process and the etch repair process are performed in a first chamber on the plasma-based reactor and wherein the ash process and the ash repair process are performed in a second chamber.

13. The method of claim 1, further comprising the steps of:
    prior to forming the interconnect structure, forming at least one MOS transistor formed in and on the substrate, the MOS transistor comprising a source and drain having a channel region interposed between, and a gate electrode and a gate insulator over the channel region; and forming a layer of dielectric insulation including at least one metal contact electrically coupled to the transistor, wherein the interconnect structure is electrically coupled to the metal contact.

14. A method of forming an interconnect structure for an integrated circuit, comprising the steps of:
forming a dielectric stack on a substrate comprising an etch-stop layer, an ultra low-k dielectric layer on the etch-stop layer, and a hard mask layer on the ultra low-k dielectric layer;
patterning a via photoresist masking layer on the dielectric stack to define a plurality of vias;
etching the plurality of via openings into the hard mask layer and etching the plurality of via openings through the ultra low-k dielectric layer and stopping on the etch-stop layer wherein the via etching process comprises breaking the via etch into a plurality of plasma via etch sub-processes and performing an in situ via etch repair process between each of the plasma via etch sub-processes, wherein the via etch repair process comprises flowing at least one hydrocarbon into the reactor and generating a plasma for a time in the range of 5 sec to 20 sec and a flow rate of hydrocarbon between 0.1 sccm to 300 sccm;
filling the plurality of via openings with an organic material;
patterning a trench photoresist masking layer on the dielectric stack to define a plurality of interconnect trenches where the plurality of via openings are contained within the plurality of interconnect trenches;
etching the plurality of interconnect trenches into the hard mask layer and etching the ultra low-k dielectric layer to form a plurality of trenches in the ultra low-k dielectric layer with a plasma trench etch that comprises breaking the plasma trench etch into a plurality of plasma trench etch sub-processes and performing an in situ trench etch repair process between each of the plasma trench etch sub-processes, wherein the trench etch repair process comprises flowing at least one hydrocarbon into the reactor and generating a plasma for a time in the range of 5 sec to 20 sec and a flow rate of hydrocarbon between 0.1 sccm to 300 sccm;
removing the trench photoresist pattern and the organic material using a trench ash process, wherein the trench ash process is broken into a plurality of trench pattern ash sub-processes and performing an in situ trench pattern ash repair process between each of the trench pattern ash sub-processes, wherein the trench pattern ash repair process comprises flowing at least one hydrocarbon into the reactor and generating a plasma for a time in the range of 3 sec to 30 sec and a flow rate of hydrocarbon between 0.1 sccm to 300 sccm;
removing the etch-stop layer with a plasma etch; and
forming a metal conductor in the plurality of features.

15. The method of claim 14, further comprising removing the via photoresist pattern using a via ash process, wherein the via ash process is broken into a plurality of via pattern ash sub-processes and performing an in situ via pattern ash repair process after each via pattern ash sub-process, wherein the via pattern ash repair process comprises flowing at least one hydrocarbon into the reactor and generating a plasma for a time in the range of 3 sec to 30 sec and a flow rate of hydrocarbon between 0.1 sccm to 300 sccm.

16. The method of claim 14, wherein the via etch repair process and the trench etch repair process are performed with a pressure in the range of 5 mT to 100 mT, a source power in the range of 100 Watts to 1000 Watts, a bias power in the range of 0 Watts to 1000 Watts, a hydrocarbon flow in the range of 10 sccm to 300 sccm, an inert gas flow in the range of 0 sccm to 500 sccm, a temperature in the range of 20° C. to 60° C.

17. The method of claim 14, wherein the hydrocarbon for the via etch repair process and the trench etch repair process are at least one selected from the group consisting of $CH_4$, $C_2H_6$, $C_3H_8$, other saturated hydrocarbons ($C_nH_{2n+2}$ where n≥4), and unsaturated hydrocarbons ($C_nH_{2n}$ where n≥1).

18. The method of claim 15, wherein the hydrocarbons for the via pattern ash repair process, the trench pattern ash repair process, the via etch repair process, and the trench etch repair process are the same hydrocarbon selected from the group consisting of $CH_4$, $C_2H_6$, $C_3H_8$, other saturated hydrocarbons ($C_nH_{2n+2}$ where n≥4), and unsaturated hydrocarbons ($C_nH_{2n}$ where n≥1).

19. The method of claim 15, wherein the hydrocarbons for the via pattern ash repair process and the trench pattern ash repair process are different than the hydrocarbons for the via etch repair process and the trench etch repair process.

20. The method of claim 15, wherein the via etch process, and the via etch repair process are performed in a first plasma chamber on the plasma-based reactor and wherein the trench ash process, and the trench ash repair process are performed in a second plasma chamber on the plasma-based reactor.

* * * * *